(12) United States Patent
Chen et al.

(10) Patent No.: US 12,556,176 B2
(45) Date of Patent: Feb. 17, 2026

(54) GATE DRIVE CIRCUIT

(71) Applicant: RICHTEK TECHNOLOGY CORP., Hsinchu County (TW)

(72) Inventors: Ping-Liang Chen, Hsinchu (TW); Li-Di Lo, Hsinchu (TW); Chien-Fu Tang, Hsinchu (TW)

(73) Assignee: RICHTEK TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 18/663,108

(22) Filed: May 14, 2024

(65) Prior Publication Data

US 2025/0337402 A1    Oct. 30, 2025

(30) Foreign Application Priority Data

Apr. 26, 2024  (TW) .................. 113115670

(51) Int. Cl.
*H03K 17/0812* (2006.01)
*H03K 17/08* (2006.01)

(52) U.S. Cl.
CPC .............. *H03K 17/08122* (2013.01); *H03K 2017/0806* (2013.01)

(58) Field of Classification Search
CPC .............. H03K 17/063; H03K 17/06; H03K 2217/0036; H03K 2217/00; H03K 2217/0018; H03K 2217/0027; H03K 2217/0063; H03K 2217/0072; H03K 2217/0081; H02M 1/08; H02M 1/32; H02M 1/081; H02M 1/082; H02M 1/083; H02M 1/084; H02M 1/0845; H02M 1/088; H02M 1/092; H02M 1/096
See application file for complete search history.

(56) References Cited

U.S. PATENT DOCUMENTS 8,354,798 B2 * 1/2013 Redjebian .............. H05B 41/34
                                                       315/120
11,716,081 B2   8/2023 Zou

FOREIGN PATENT DOCUMENTS

TW          I334266       12/2010

* cited by examiner

*Primary Examiner* — Diana J. Cheng
(74) *Attorney, Agent, or Firm* — Winston Hsu

(57) ABSTRACT

A gate drive circuit includes a voltage summer, a driver, a power transistor and a resistor. The voltage summer includes a first input terminal for receiving a reference voltage, a second input terminal for receiving a common source voltage, and an output terminal for generating a summed voltage according to the common source voltage and the reference voltage. The driver includes a first input terminal coupled to the output terminal of the voltage summer, a second input terminal for receiving a pulse width modulation (PWM) signal, and an output terminal for generating a gate voltage according to the summed voltage and the pulse width modulation signal. The power transistor includes a first terminal, a second terminal, and a control terminal coupled to the output terminal of the driver. The resistor is coupled between the second terminal of the power transistor and a ground terminal.

19 Claims, 8 Drawing Sheets

GATE DRIVE CIRCUIT

BACKGROUND OF THE INVENTION

1. Field of the Invention

The present disclosure is related to a circuit, and more particularly to a gate drive circuit.

2. Description of the Prior Art

A gate drive circuit (also known as a gate driver) is used to drive the gate of power transistors (e.g., Insulated Gate Bipolar Transistors (IGBTs) or power MOSFETs). The main purpose of a gate drive circuit is to address issues that arise during the switching process of power transistors. The primary functions of a gate driver include level shifting and amplifier circuits, which are crucial for ensuring that the power transistor can quickly switch to the on or off state at the appropriate voltage and current levels. Fast switching not only reduces power loss but also prevents damage to the transistor due to overheating during the switching process. When designing a gate drive circuit, it is necessary to consider the charging and discharging requirements of the gate capacitance, as well as the potential for large currents and high voltages during switching. For example, when a transistor switches, it needs to charge or discharge the gate capacitance, and there may be a momentary high current flowing through the transistor, causing it to heat up. The role of the gate drive circuit is to shorten the switching time, reduce switching losses, and ensure that the power transistor is not damaged by improper control.

Gate drive circuits are typically provided with signals from logic circuits to ensure switching speed and efficiency. Gate drive circuits play a critical role in many applications, such as DC converters, motors, and other high-power electronic systems.

However, the source voltage of the power transistor may be affected by factors such as current sensing resistors or other reasons, causing the source voltage potential to increase when the power transistor is turned on, which changes the resistance of the power transistor when it is turned on and affects the efficiency of the transistor.

SUMMARY OF THE INVENTION

An embodiment provides a gate drive circuit including a voltage summer, a driver, a power transistor and a resistor. The voltage summer includes a first input terminal for receiving a reference voltage, a second input terminal for receiving a common source voltage, and an output terminal for generating a summed voltage according to the common source voltage and the reference voltage. The driver includes a first input terminal coupled to the output terminal of the voltage summer, a second input terminal for receiving a pulse width modulation (PWM) signal, and an output terminal for generating a gate voltage according to the summed voltage and the pulse width modulation signal. The power transistor includes a first terminal, a second terminal, and a control terminal coupled to the output terminal of the driver. The resistor is coupled between the second terminal of the power transistor and a ground terminal.

These and other objectives of the present disclosure will no doubt become obvious to those of ordinary skill in the art after reading the following detailed description of the preferred embodiment that is illustrated in the various figures and drawings.

DETAILED DESCRIPTION

The following description sets forth numerous specific details to provide a thorough understanding of the present disclosure. However, those skilled in the art will appreciate that the present disclosure may be practiced without involving these specific details. In some instances, well-known methods, procedures, components, and circuits have not been described in detail to avoid obscuring the present disclosure. In this specification, technical features individually described within a single embodiment may be implemented separately or simultaneously with technical features from other embodiments.

Figure 1:
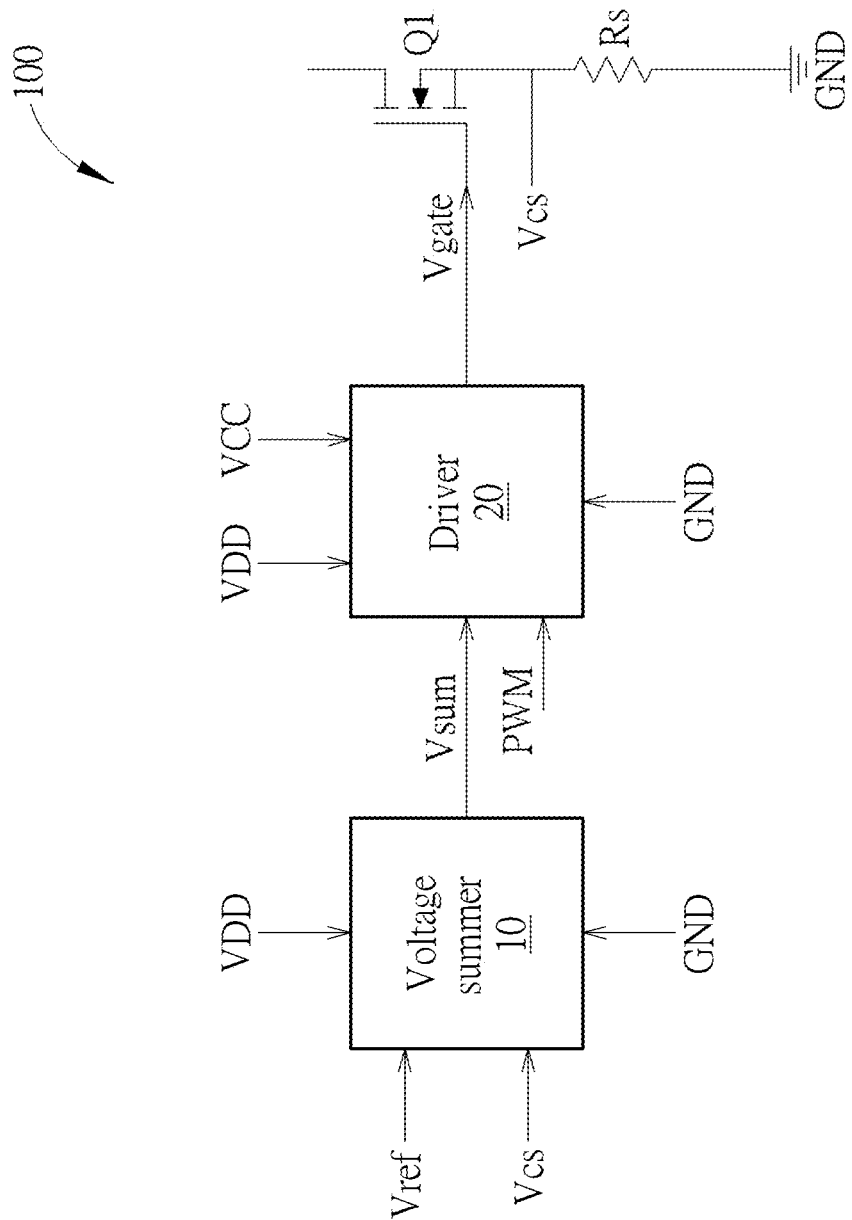
FIG. 1 is a schematic diagram of a gate drive circuit of an embodiment.

FIG. 1 is a schematic diagram of a gate drive circuit 100 of an embodiment of the present disclosure. The gate drive circuit 100 includes a voltage summer 10, a driver 20, a power transistor Q1, and a resistor Rs. The voltage summer 10 includes a first input terminal, a second input terminal, and an output terminal. The first input terminal is used to receive a reference voltage Vref, the second input terminal is used to receive a common source voltage Vcs, and the output terminal is used to generate a summed voltage Vsum based on the common source voltage Vcs and the reference voltage Vref. The driver 20 includes a first input terminal, a second input terminal, and an output terminal. The first input terminal is coupled to the output terminal of the voltage summer 10, the second input terminal is used to receive a pulse width modulation signal PWM, and the output terminal is used to generate a gate voltage Vgate based on the summed voltage Vsum and the pulse width modulation signal PWM. The power transistor Q1 includes a first terminal (drain), a second terminal (source), and a control terminal (gate). The control terminal is coupled to the output terminal of the driver 20. The resistor Rs is coupled between the second terminal of the power transistor Q1 and the ground terminal GND.

In some embodiments, the driver 20 may be coupled to the ground terminal GND and receive a circuit voltage VCC and a device voltage VDD. The voltage summer 10 may be coupled to the ground terminal GND and receive the device voltage VDD. Both the circuit voltage VCC and the device voltage VDD are power supplies that can be used to drive circuit components, where the circuit voltage VCC may be higher than the device voltage VDD.

The driver 20 can be used to track the common source voltage Vcs and soft-start the gate voltage Vgate, which will be described in more detail below.

Figure 2:
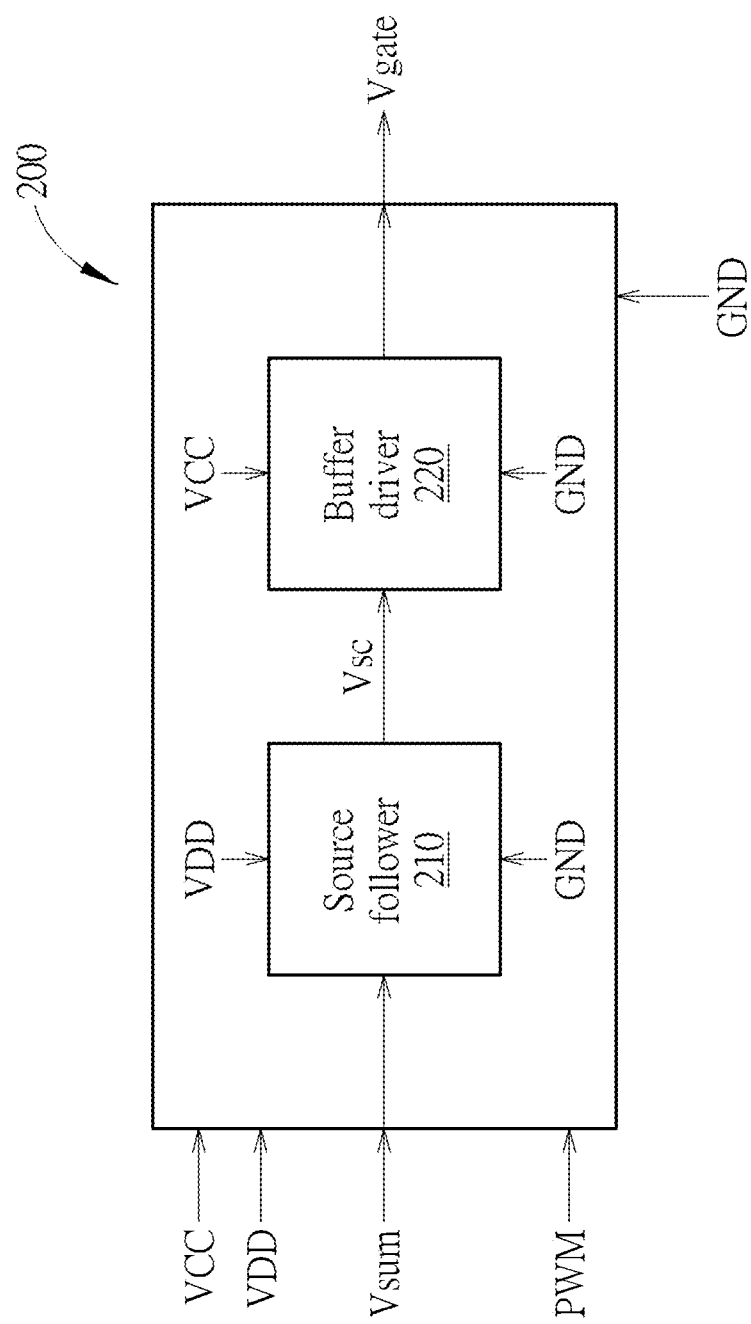
FIG. 2 is a schematic diagram of an embodiment of the driver in FIG. 1.

FIG. 2 is a schematic diagram of a driver 200 according to an embodiment of the present disclosure. The driver 200 is an implementation of the driver 20. The driver 200 includes a source follower 210 and a buffer driver 220. The source follower 210 is coupled to the first input terminal of the driver 200 and is used to generate a source follower voltage Vsc based on the summed voltage Vsum. The buffer driver 220 is coupled between the source follower 210 and the output terminal of the driver 200 and is used to generate the gate voltage Vgate based on the source follower voltage Vsc.

When a simple logic controller cannot directly provide sufficient output current to drive the gate capacitance of a power switch (such as power transistor Q1), a pulse width modulation signal PWM is used to drive the power switch. The input signal of the gate drive circuit usually comprises a series of logic pulses, which can be generated by a microcontroller, programmable logic gate array, comparator, or other logic circuits. However, these signal sources themselves may not be able to provide enough current to turn the power transistor on and off within the required timing. The driver 200 can convert the pulse width modulation signal PWM into a bipolar signal suitable for driving the power switch (such as power transistor Q1), which can then be used to drive the power switch.

A source follower, such as the source follower 210, is a common circuit configuration used in analog electronic circuits. It is essentially a voltage buffer that provides high input impedance and low output impedance, making it ideal for interfacing between high-impedance sources and low-impedance loads.

The basic structure of a source follower comprises a field-effect transistor (FET) and a load resistor. The input signal is applied to the gate terminal of the FET, while the output signal is taken from the source terminal. The load resistor is connected between the source terminal and ground (or a fixed reference voltage).

The key characteristics of a source follower are high input impedance, low output impedance, unity gain, wide bandwidth and no phase inversion. The gate terminal of the FET draws very little current, resulting in high input impedance. This allows the source follower to minimize loading effects on the input signal source. In addition, the source follower can supply a relatively large current to the load due to the FET's ability to control the current through its channel. This results in low output impedance, enabling the source follower to drive low-impedance loads effectively. Further, the output voltage of a source follower closely follows the input voltage, with a small voltage drop across the FET. The voltage gain is typically slightly less than 1 (around 0.8 to 0.9) due to the FET's characteristics. Furthermore, the source follower can operate over a wide range of frequencies, making them suitable for applications requiring fast signal transmission. Finally, the output signal of a source follower is in phase with the input signal, as there is no polarity inversion.

The function of the source follower is to transmit the changes in the input voltage to the output terminal while maintaining the output voltage the same as the input voltage. In other words, the source follower has an extremely high input resistance, so it does not place a large load on the input signal. Also, the source follower has a low output resistance, which helps drive the load resistance. When the input voltage changes, the transistor in the source follower adjusts its source current to maintain a stable output voltage, and the output voltage follows the changes in the input voltage.

The buffer driver, such as the buffer driver 220, can be designed as a type of source follower, whose function is to drive the gate voltage Vgate to rise. The falling of the gate voltage Vgate is controlled by another transistor coupled to the ground.

Figure 3:
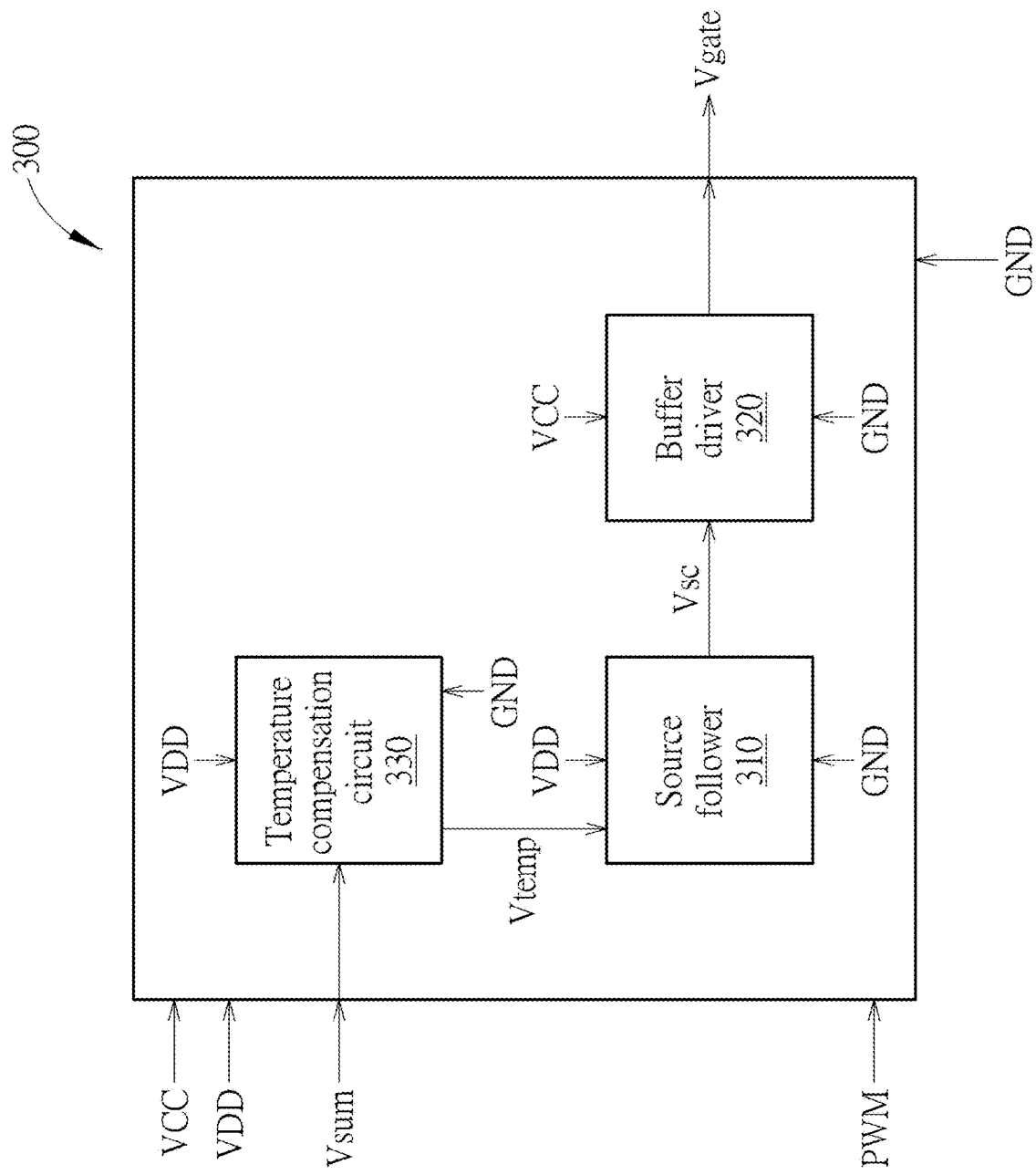
FIG. 3 is a schematic diagram of another embodiment of the driver in FIG. 1.

FIG. 3 is a schematic diagram of a driver 300 of an embodiment of the present disclosure. The driver 300 is an implementation of the driver 20. The driver 300 includes a source follower 310, a buffer driver 320, and a temperature compensation circuit 330. The temperature compensation circuit 330 is coupled to the first input terminal of the driver 300 and is used to generate a temperature compensation voltage Vtemp based on the summed voltage Vsum. The source follower 310 is used to generate a source follower voltage Vsc based on the temperature compensation voltage Vtemp. The buffer driver 320 is coupled between the source follower 310 and the output terminal of the driver 300 and is used to generate the gate voltage Vgate based on the source follower voltage Vsc.

A temperature compensation circuit, such as the temperature compensation circuit 330, is a component used to address the performance variations of components at different temperatures. In electronic circuits, the resistance values of specific components (e.g., inductors or transistors) may change with temperature, affecting the performance of the entire circuit. The embodiment uses the temperature compensation circuit 330 to offset this temperature effect by inserting a thermistor with a negative temperature coefficient into the current loop to compensate for the change in resistance value of specific components with temperature. Different current sensing architectures (e.g., summed current sensing or differential current sensing) may have different temperature compensation design methods, which will not be elaborated here. With proper design, the impact of temperature changes on the DCR value can be effectively reduced, providing accurate current information.

In the embodiment, the temperature compensation circuit 330 can be designed to compensate for the temperature effects on various components within the driver circuit 300, as well as the power transistor Q1. This comprehensive approach ensures that the overall performance of the system remains stable and predictable across a wide range of operating temperatures.

The temperature compensation range of the temperature compensation circuit 330 may include the temperature effects of the source follower 310 and the buffer driver 320, as well as the temperature effects on the threshold voltage of the power transistor Q1.

The characteristics of the field-effect transistor (FET) used in the source follower 310 can vary with temperature. For example, the threshold voltage and the transconductance of the FET may change, affecting the output voltage and the gain of the source follower. The temperature compensation circuit 330 can adjust the bias conditions of the source follower to maintain a stable output voltage despite temperature variations.

Similarly, the buffer driver 320 may also experience temperature-dependent changes in its performance. The temperature compensation circuit 330 can modify the bias currents or voltages of the buffer driver to ensure that it continues to provide a consistent output drive capability across the desired temperature range.

The threshold voltage of the power transistor Q1 can vary significantly with temperature. In general, the threshold voltage decreases as the temperature increases, which can lead to changes in the switching behavior and conduction losses of the transistor. By including the temperature effects on the power transistor's threshold voltage within its compensation range, the temperature compensation circuit 330 can adjust the gate drive voltage (Vgate) to maintain optimal switching performance and minimize losses.

The temperature compensation circuit 330 may employ various techniques to achieve its goal, such as using temperature-sensitive elements (e.g., or diodes) thermistors to generate temperature-dependent voltages or currents, which are then used to adjust the bias conditions of the affected components. The specific implementation of the temperature compensation circuit will depend on the desired compensation range, the accuracy requirements, and the available circuit resources.

Figure 4:
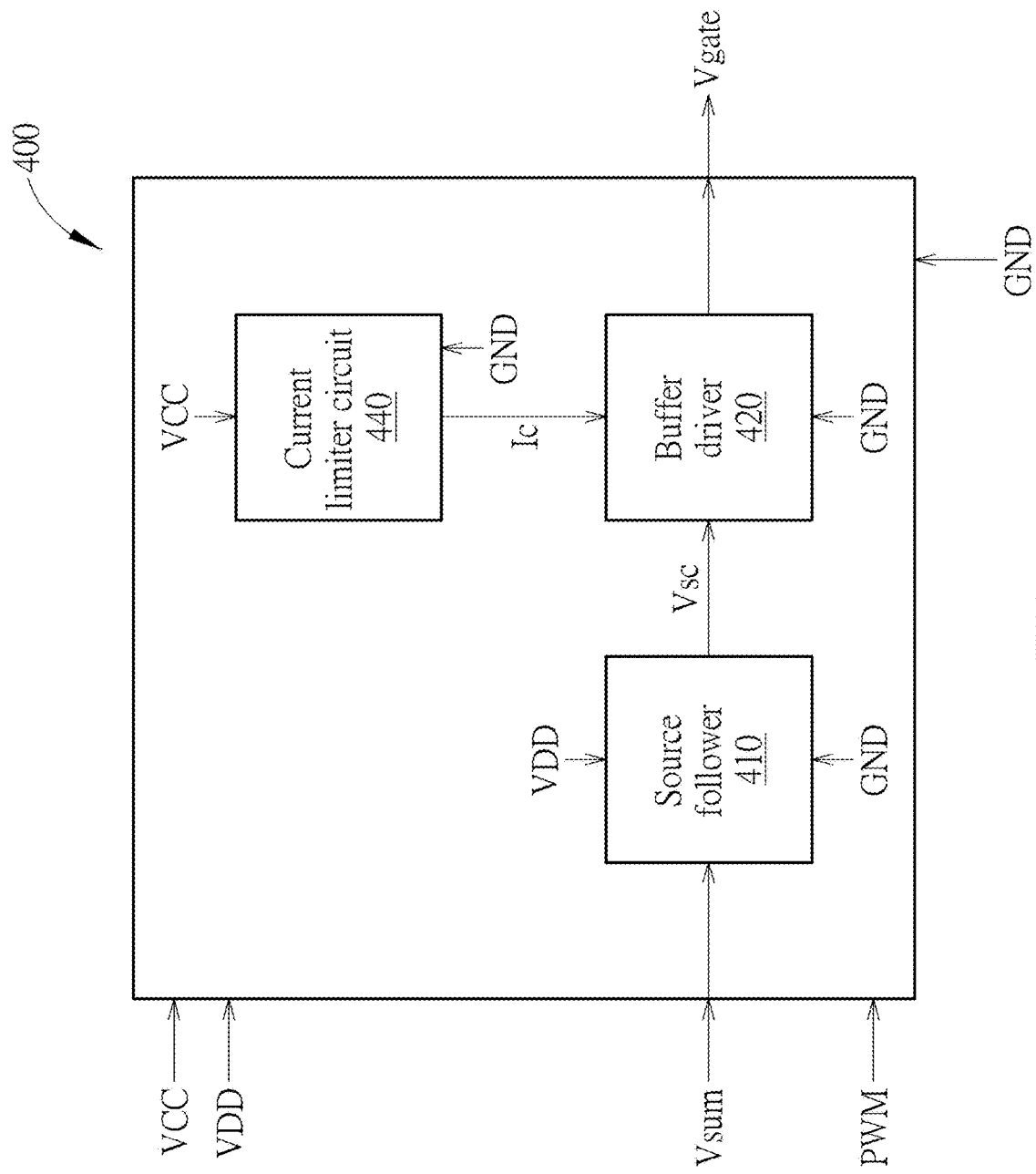
FIG. 4 is a schematic diagram of another embodiment of the driver in FIG. 1.

FIG. 4 is a schematic diagram of a driver 400 of an embodiment of the present disclosure. The driver 400 is an implementation of the driver 20. The driver 400 includes a source follower 410, a buffer driver 420, and a current limiter circuit 440. The source follower 410 is coupled to the first input terminal of the driver 400 and is used to generate a source follower voltage Vsc based on the summed voltage Vsum. The current limiter circuit 440 is used to generate a current limiter signal Ic based on the circuit voltage VCC. The buffer driver 420 is coupled to the source follower 410, the current limiter circuit 440, and the output terminal of the driver 400, and is used to generate the gate voltage Vgate based on the source follower voltage Vsc and the current limiter signal Ic.

The current limiter circuit 440 can generate a current limiter signal Ic to limit the rising slope of the gate voltage Vgate, thereby controlling the large instantaneous current caused by the power transistor Q1 during turn-on, achieving control of the slope of the gate voltage Vgate, and reducing the electromagnetic interference (EMI) generated by the system.

A current limiter circuit, such as the current limiter circuit 440, is designed to limit the maximum current that can flow through a specific portion of an electronic circuit. In the context of the driver 400, the current limiter circuit 440 is used to control the rising slope of the gate voltage Vgate, which in turn limits the instantaneous current through the power transistor Q1 during turn-on.

The current limiter circuit 440 can be implemented using various techniques, depending on the specific requirements of the application. In some embodiments, current mirrors can be used to create a current limiter circuit 440. The input current is passed through differential amplifier, which generates a voltage proportional to the input current. This voltage is then converted into an output current that is proportional to the input current, effectively limiting the maximum current that can flow through the circuit. In some embodiments, transistors can be configured to act as current limiters by controlling their base or gate voltage. When the current through the transistor reaches a predetermined level, the transistor starts to limit the current by reducing its conductivity. In more advanced implementation, feedback control techniques can be employed to dynamically adjust the current limit based on the circuit conditions. This can involve monitoring the current through a sense resistor and using an amplifier or comparator to control the current limiting element.

Figure 5:
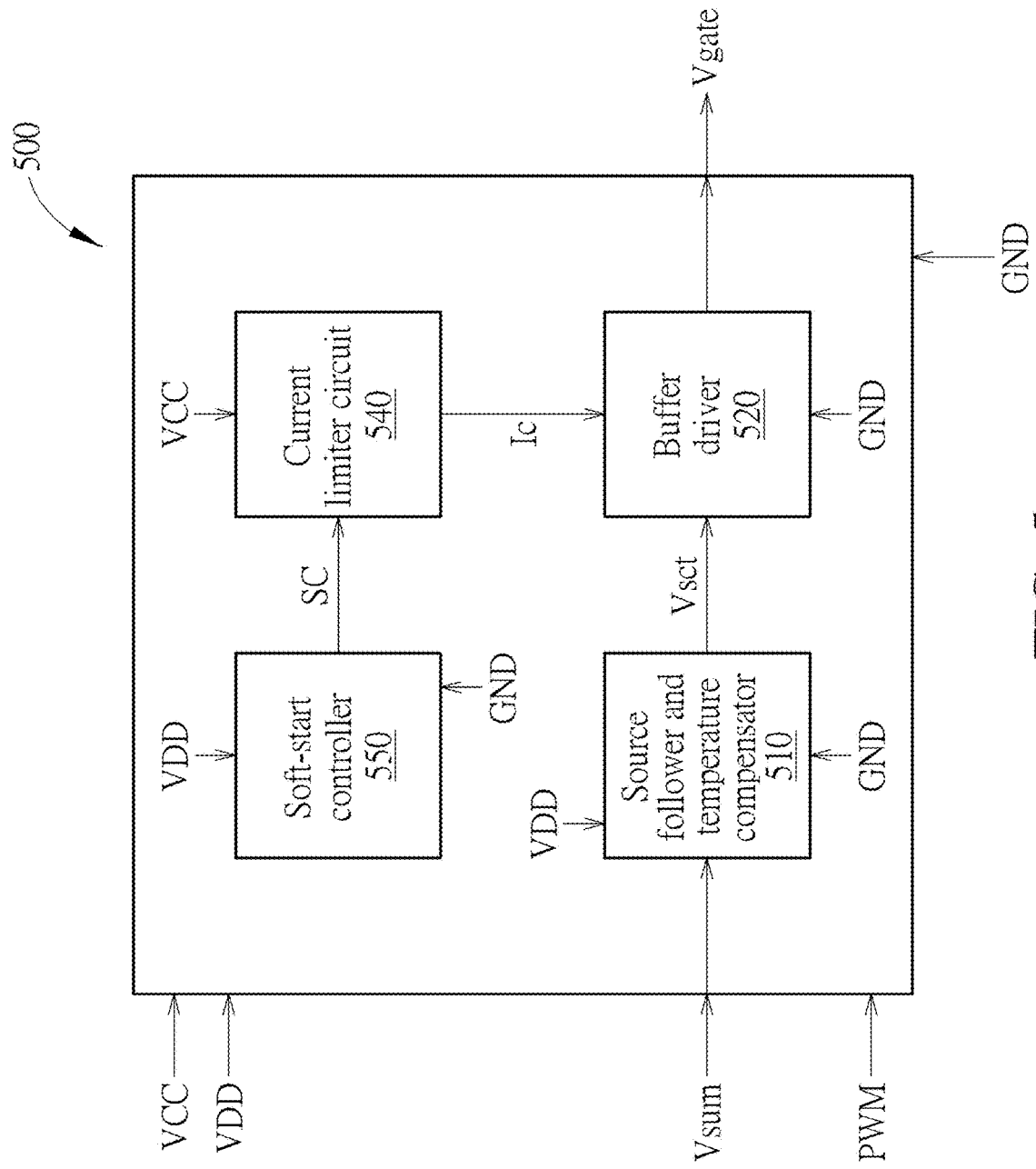
FIG. 5 is schematic diagram of another embodiment of the driver in FIG. 1.

FIG. 5 is a schematic diagram of a driver 500 of an embodiment of the present disclosure. The driver 500 is an implementation of the driver 20. The driver 500 includes a source follower and temperature compensator 510, a buffer driver 520, a current limiter circuit 540, and a soft-start controller 550. The soft-start controller 550 is used to generate a soft-start signal SC. The source follower and temperature compensator 510 is coupled to the first input terminal of the driver 500 and is used to generate a source follower and temperature compensated voltage Vsct according to the summed voltage Vsum. The current limiter circuit 540 is used to generate a current limiter signal Ic based on the circuit voltage VCC and the soft-start signal SC. The buffer driver 520 is coupled to the source follower and temperature compensator 510, the current limiter circuit 540, and the output terminal of the driver 500, and is used to generate the gate voltage Vgate based on the source follower and temperature compensated voltage Vsct and the current limiter signal Ic. The source follower and temperature compensator 510 may possess the functions of the source follower 310 and the temperature compensation circuit 330.

The soft-start controller 550 generates a soft-start signal SC to control the current limiter circuit 540, thereby making the rising slope of the gate voltage Vgate more gradual. This is to control the turn-on time of the power transistor Q1 (taking an N-type MOSFET as an example), making the power transistor Q1 turn on more slowly, thereby increasing the conversion efficiency of the power transistor Q1.

Figure 6:
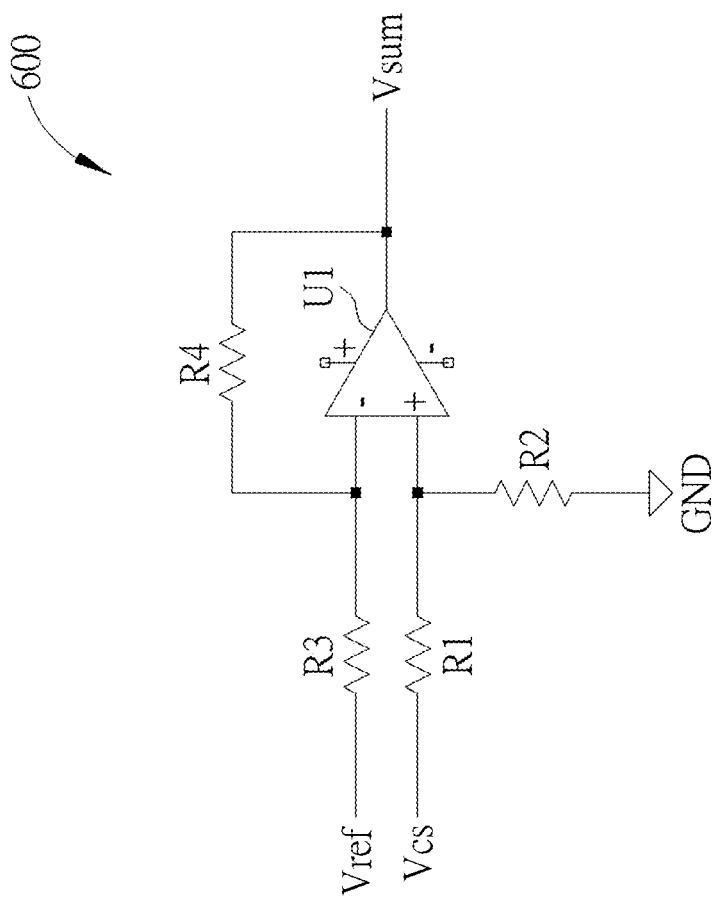
FIG. 6 is a schematic diagram of an embodiment of the voltage summer in FIG. 1.

FIG. 6 is a schematic diagram of a voltage summer 600 of an embodiment of the present disclosure. The voltage summer 600 is an implementation of the voltage summer 10. The voltage summer 600 includes an operational amplifier U1, a first resistor R1, a second resistor R2, a third resistor R3, and a fourth resistor R4. The operational amplifier U1 includes an inverting input, a non-inverting input, and an output terminal. The output terminal of the operational amplifier U1 is coupled to the output terminal of the voltage summer 600 and is used to output the summed voltage Vsum. The first resistor R1 is coupled between the non-inverting input and the second input terminal of the voltage summer 600. The second resistor R2 is coupled between the non-inverting input and the ground terminal GND. The third resistor R3 is coupled between the inverting input and the first input terminal of the voltage summer 600. The fourth resistor R4 is coupled between the inverting input and the output terminal of the voltage summer 600. The voltage summer 600 combines the resistors R1~R4 and the operational amplifier U1. The voltage summer 600 adds the reference voltage Vref and the common source voltage Vcs and outputs the summed voltage (Vsum=Vref+Vcs).

Figure 7:
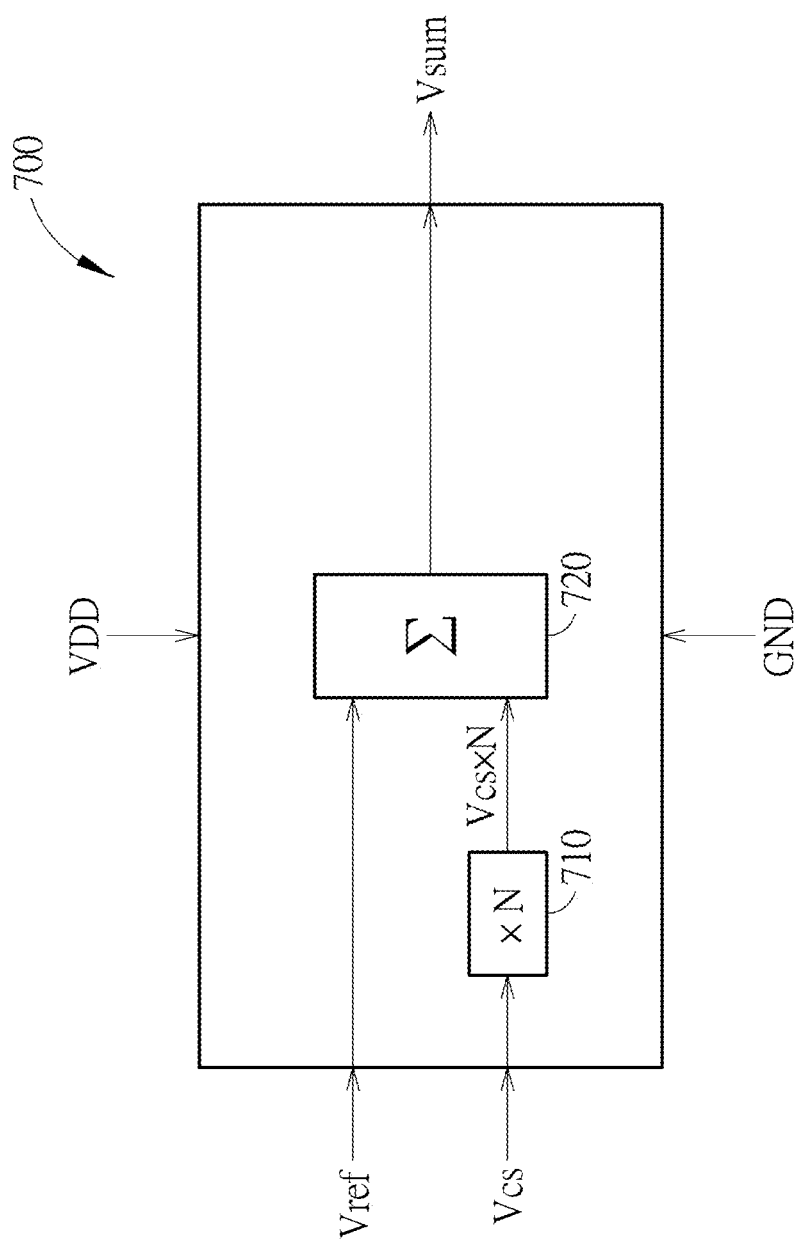
FIG. 7 is a schematic diagram of another embodiment of the voltage summer in FIG. 1.

FIG. 7 is a schematic diagram of a voltage summer 700 of an embodiment of the present disclosure. The voltage summer 700 is an implementation of the voltage summer 10. The voltage summer 700 includes a multiplier 710 and an adder 720. The multiplier 710 is coupled to the second input terminal of the voltage summer 700 and is used to multiply the common source voltage Vcs by a factor N to produce a multiplied common source voltage Vcs×N. The adder 720 is coupled to the multiplier 710, the first input terminal of the voltage summer 700, and the output terminal of the voltage summer 700, and is used to generate a summed voltage Vsum based on the multiplied common source voltage Vcs×N and the reference voltage Vref. N can be any factor used to amplify or attenuate the common source voltage Vcs.

Figure 8:
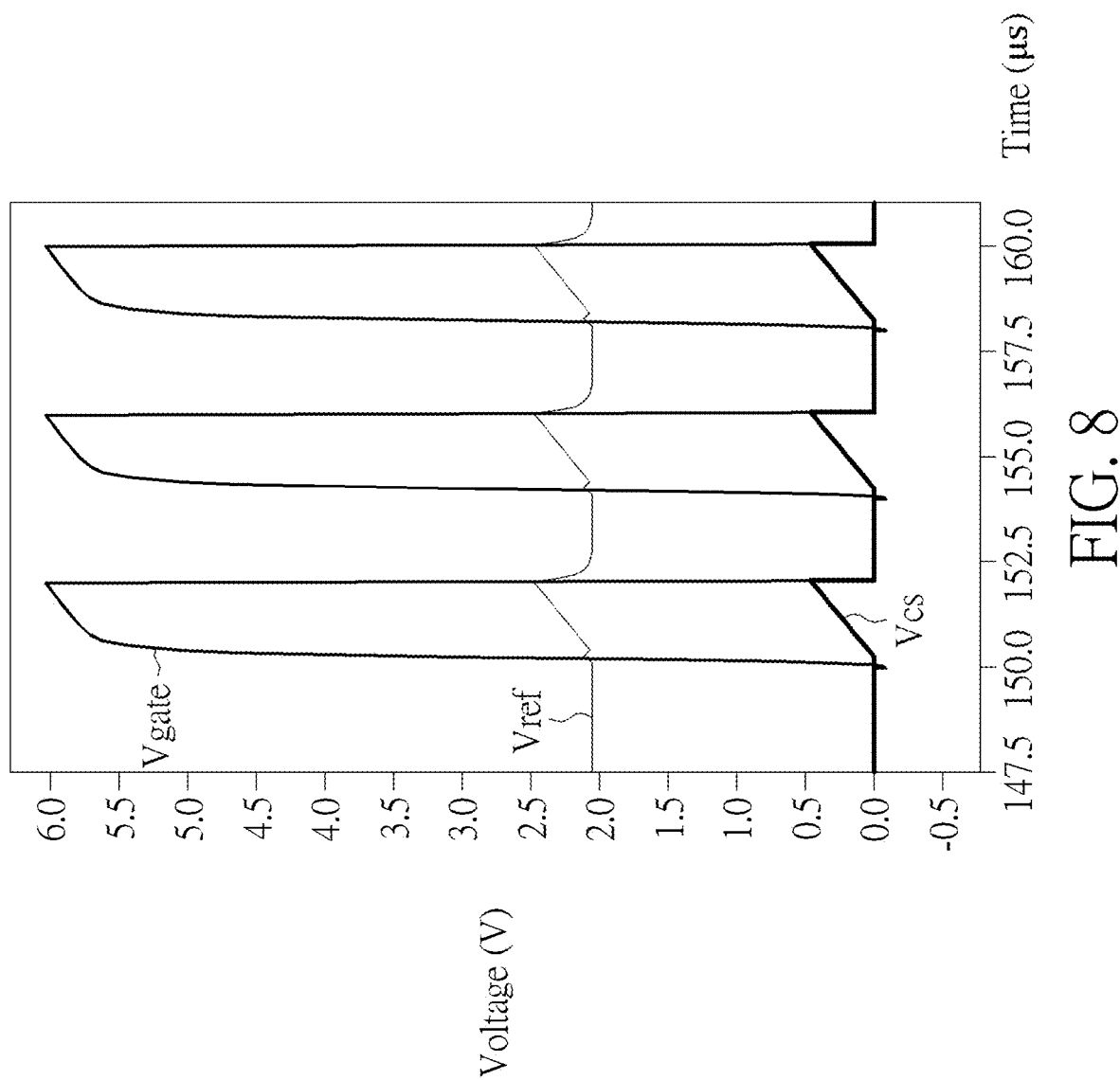
FIG. 8 is a signal diagram of the gate drive circuit of FIG. 1.

FIG. 8 is a simulated signal diagram of the gate drive circuit 100. The vertical axis of the signal diagram represents voltage (V), and the horizontal axis represents time (μs). The signal diagram shows the waveforms of the gate voltage Vgate, the common source voltage Vcs, and the reference voltage Vref. The frequency of these voltages is controlled by the frequency of the pulse width modulation signal PWM. The embodiment uses negative feedback and utilizes a source follower (e.g., source follower 210) to make the gate voltage Vgate track the common source voltage Vcs, so that when the power transistor Q1 is turned on, the gate-source voltage (VGS) can be maintained at the voltage required for the power transistor Q1 to turn on, avoiding voltage instability.

In some embodiments, digital circuits can be used to track the common source voltage Vcs. For example, an analog-to-digital converter (ADC) can be used to convert the common source voltage Vcs into a digital signal, and a digital signal processor (DSP) can be used to calculate the value of the gate voltage Vgate.

The various embodiments of the present disclosure solve the problem of gate-source voltage (VGS) fluctuations caused by changes in circuit signals (e.g., source resistor of power transistor Q1) when driving the power transistor (e.g., power transistor Q1). The embodiments of the present disclosure can track this change and reflect it back to the gate-source voltage. The solution provides a control mechanism on the gate voltage to keep the gate-source voltage (VGS) constant. This prevents the turn-on resistance of the power transistor from increasing due to changes in the common source voltage, which would reduce the overall system efficiency, thereby improving the voltage conversion efficiency.

The terminology used in the description of the various embodiments herein is for the purpose of describing particular embodiments only and is not intended to be limiting. In the description of the various embodiments and the appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The terms "coupled," "connected," "connecting," and "electrically connected" are used interchangeably in this document to refer to the state of being electrically or electronically connected. Similarly, a first entity is considered to be in "communication" with a second entity (or entities) when the first entity electrically sends and/or receives information signals to/from the second entity, regardless of whether the signals contain voice information or non-voice data/control information, and irrespective of the type of signals (analog or digital). It should be noted that the various figures, including component diagrams, shown and discussed in this document are for illustrative purposes only and are not drawn to scale.

The various illustrative components, logic, logical blocks, modules, circuits, operations and algorithm processes described in connection with the embodiments disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The various illustrative components, logic, logical blocks, modules, circuits, operations, and algorithm processes described in connection with the embodiments disclosed herein may be implemented as electronic hardware, firmware, software, or combinations thereof, including the structures disclosed in this specification and their structural equivalents. The interchangeability of hardware, firmware, and software has been described generally in terms of functionality and illustrated in the various illustrative components, blocks, modules, circuits, and processes described above. The choice of implementing such functionality in hardware, firmware, or software depends on the particular application and design constraints imposed on the overall system.

The hardware and data processing apparatus used to implement the various illustrative components, logics, logical blocks, modules, and circuits described in connection with the aspects disclosed herein may be implemented or performed with a general-purpose single-chip or multi-chip processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor or any conventional processor, controller, microcontroller, or state machine. A processor may also be implemented as a combination of computing devices, such as a combination of a DSP and a microprocessor, multiple microprocessors, one or more microprocessors in conjunction with a DSP core, or any other such configuration. In some embodiments, specific processes, operations, and methods may be performed by circuitry that is dedicated to a particular function.

As described above, in some aspects embodiments of the subject matter described in this specification can be implemented as software. For example, various functions of components disclosed herein or various blocks or steps of a method, operation, process or algorithm disclosed herein can be implemented as one or more modules of one or more computer programs. Such computer programs can include non-transitory processor-executable or computer-executable instructions encoded on one or more tangible processor-readable or computer-readable storage media for execution by, or to control the operation of, data processing apparatus including the components of the devices described herein. By way of example, and not limitation, such storage media may include RAM, ROM, EEPROM, CD-ROM or other optical disk storage, magnetic disk storage or other magnetic storage devices, or any other medium that may be used to store program code in the form of instructions or data structures. Combinations of the above should also be included within the scope of storage media.

While some embodiments comprise the disclosed features and may therefore include additional features not specifically described, other embodiments may be essentially free of or completely free of non-disclosed elements. That is, non-disclosed elements may optionally be essentially omitted or completely omitted.

Additionally, various features that are described in this specification in the context of separate embodiments also can be implemented in combination in a single implementation. Conversely, various features that are described in the context of a single implementation also can be implemented in multiple embodiments separately or in any suitable sub-combination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example process in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the embodiments described should not be understood as requiring such separation in all embodiments, and it should be understood that the described program components and systems can generally be integrated together in a single software package or packaged into multiple software packages. Additionally, other embodiments are within the scope of the following claims. In some cases, the actions recited in the claims can be performed in a different order and still achieve desirable results.

Various modifications to the embodiments described in this disclosure may be readily apparent to persons having ordinary skill in the art, and the generic principles defined herein may be applied to other embodiments without departing from the spirit or scope of this disclosure. Thus, the claims are not intended to be limited to the embodiments shown herein, but are to be accorded the widest scope consistent with this disclosure, the principles and the novel features disclosed herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate drive circuit comprising:
   a voltage summer comprising:
      a first input terminal for receiving a reference voltage;
      a second input terminal for receiving a common source voltage;
      an output terminal for generating a summed voltage according to the common source voltage and the reference voltage;
      a multiplier coupled to the second input terminal of the voltage summer, configured to multiply the common source voltage by a multiple factor to generate a multiple common source voltage; and
      an adder coupled to the multiplier, the first input terminal of the voltage summer, and the output terminal of the voltage summer, configured to generate the summed voltage according to the multiple common source voltage and the reference voltage;
   a driver comprising:
      a first input terminal coupled to the output terminal of the voltage summer;
      a second input terminal for receiving a pulse width modulation (PWM) signal; and
      an output terminal for generating a gate voltage according to the summed voltage and the pulse width modulation signal;
   a power transistor, comprising:
      a first terminal;
      a second terminal; and
      a control terminal coupled to the output terminal of the driver; and
   a resistor coupled between the second terminal of the power transistor and a ground terminal.

2. The gate drive circuit of claim 1, wherein the driver is configured to track the common source voltage and soft-start the gate voltage.

3. The gate drive circuit of claim 1, wherein the driver further comprises:
   a source follower coupled to the first input terminal of the driver, configured to generate a source follower voltage according to the summed voltage; and
   a driver buffer coupled to the source follower and the output terminal of the driver, configured to generate the gate voltage according to the source follower voltage.

4. The gate drive circuit of claim 3, wherein the source follower is further configured to soft-start the gate voltage and track the common source voltage.

5. The gate drive circuit of claim 1, wherein the driver further comprises:
   a temperature compensation circuit coupled to the first input terminal of the driver, configured to generate a temperature compensation voltage according to the summed voltage;
   a source follower configured to generate a source follower voltage according to the temperature compensation voltage; and
   a driver buffer coupled to the source follower and the output terminal of the driver, configured to generate the gate voltage according to the source follower voltage.

6. The gate drive circuit of claim 5, wherein the source follower is further configured to soft-start the gate voltage and track the common source voltage.

7. The gate drive circuit of claim 1, wherein the driver further comprises:
   a source follower coupled to the first input terminal of the driver, configured to generate a source follower voltage according to the summed voltage;
   a current limiter circuit configured to generate a current limiter signal according a circuit voltage; and
   a driver buffer coupled to the source follower, the current limiter circuit and the output terminal of the driver, configured to generate the gate voltage according to the source follower voltage and the current limiter signal.

8. The gate drive circuit of claim 7, wherein the source follower is further configured to soft-start the gate voltage and track the common source voltage.

9. A gate drive circuit comprising:
   a voltage summer comprising:
      a first input terminal for receiving a reference voltage;
      a second input terminal for receiving a common source voltage; and
      an output terminal for generating a summed voltage according to the common source voltage and the reference voltage;
   a driver comprising:
      a first input terminal coupled to the output terminal of the voltage summer;
      a second input terminal for receiving a pulse width modulation (PWM) signal;

an output terminal for generating a gate voltage according to the summed voltage and the pulse width modulation signal;
a soft start controller configured to generate a soft start signal;
a source follower and temperature compensator, coupled to the first input terminal of the driver, configured to generate a source follower and temperature compensation voltage according to the summed voltage;
a current limiter circuit coupled to the soft start controller, configured to generate a current limiter signal according to a circuit voltage and the soft start signal; and
a driver buffer coupled to the source follower and temperature compensator, the current limiter circuit and the output terminal of the driver, configured to generate the gate voltage according to the source follower and temperature compensation voltage and the current limiter signal;
a power transistor, comprising:
a first terminal;
a second terminal; and
a control terminal coupled to the output terminal of the driver; and
a resistor coupled between the second terminal of the power transistor and a ground terminal.

10. A gate drive circuit comprising:
a voltage summer comprising:
a first input terminal for receiving a reference voltage;
a second input terminal for receiving a common source voltage;
an output terminal for generating a summed voltage according to the common source voltage and the reference voltage;
an operational amplifier comprising:
an inverting input terminal;
a non-inverting input terminal; and
an output terminal coupled to the output terminal of the voltage summer;
a first resistor coupled between the non-inverting input terminal and the second input terminal of the voltage summer;
a second resistor coupled between the non-inverting input terminal and the ground terminal;
a third resistor coupled between the inverting input terminal and the first input terminal of the voltage summer; and
a fourth resistor coupled between the inverting input terminal and the output terminal of the voltage summer;
a driver comprising:
a first input terminal coupled to the output terminal of the voltage summer;
a second input terminal for receiving a pulse width modulation (PWM) signal; and
an output terminal for generating a gate voltage according to the summed voltage and the pulse width modulation signal;
a power transistor, comprising:
a first terminal;
a second terminal; and
a control terminal coupled to the output terminal of the driver; and
a resistor coupled between the second terminal of the power transistor and a ground terminal.

11. The gate drive circuit of claim 1, wherein the driver is further coupled to the ground terminal and receives a circuit voltage and a device voltage.

12. The gate drive circuit of claim 1, wherein the voltage summer is further coupled to the ground terminal and receives a device voltage.

13. The gate drive circuit of claim 10, wherein the driver is configured to track the common source voltage and soft-start the gate voltage.

14. The gate drive circuit of claim 10, wherein the driver further comprises:
a source follower coupled to the first input terminal of the driver, configured to generate a source follower voltage according to the summed voltage; and
a driver buffer coupled to the source follower and the output terminal of the driver, configured to generate the gate voltage according to the source follower voltage.

15. The gate drive circuit of claim 14, wherein the source follower is further configured to soft-start the gate voltage and track the common source voltage.

16. The gate drive circuit of claim 10, wherein the driver further comprises:
a temperature compensation circuit coupled to the first input terminal of the driver, configured to generate a temperature compensation voltage according to the summed voltage;
a source follower configured to generate a source follower voltage according to the temperature compensation voltage; and
a driver buffer coupled to the source follower and the output terminal of the driver, configured to generate the gate voltage according to the source follower voltage.

17. The gate drive circuit of claim 16, wherein the source follower is further configured to soft-start the gate voltage and track the common source voltage.

18. The gate drive circuit of claim 10, wherein the driver further comprises:
a source follower coupled to the first input terminal of the driver, configured to generate a source follower voltage according to the summed voltage;
a current limiter circuit configured to generate a current limiter signal according a circuit voltage; and
a driver buffer coupled to the source follower, the current limiter circuit and the output terminal of the driver, configured to generate the gate voltage according to the source follower voltage and the current limiter signal.

19. The gate drive circuit of claim 18, wherein the source follower is further configured to soft-start the gate voltage and track the common source voltage.

* * * * *